(12) United States Patent
Yang et al.

(10) Patent No.: US 12,012,660 B2
(45) Date of Patent: Jun. 18, 2024

(54) METHOD FOR MANUFACTURING LCP-BASED FLEXIBLE COPPER-CLAD PLATE, AND ARTICLE THEREOF

(71) Applicant: Richview Electronics Co., Ltd., Wuhan (CN)

(72) Inventors: Nianqun Yang, Zhuhai (CN); Zhigang Yang, Zhuhai (CN); Zhiqiang Zhang, Zhuhai (CN); Honglin Song, Zhuhai (CN)

(73) Assignee: Richview Electronics Co., Ltd., Wuhan (CN)

( * ) Notice: Subject to any disclaimer, the term of this patent is extended or adjusted under 35 U.S.C. 154(b) by 890 days.

(21) Appl. No.: 17/042,337

(22) PCT Filed: Mar. 20, 2019

(86) PCT No.: PCT/CN2019/078909
§ 371 (c)(1),
(2) Date: Sep. 28, 2020

(87) PCT Pub. No.: WO2019/184785
PCT Pub. Date: Oct. 3, 2019

(65) Prior Publication Data
US 2021/0025061 A1 Jan. 28, 2021

(30) Foreign Application Priority Data
Mar. 30, 2018 (CN) .......................... 201810291943.2

(51) Int. Cl.
C23F 17/00 (2006.01)
C23C 14/02 (2006.01)
(Continued)

(52) U.S. Cl.
CPC ............ *C23F 17/00* (2013.01); *C23C 14/022* (2013.01); *C23C 14/024* (2013.01);
(Continued)

(58) Field of Classification Search
None
See application file for complete search history.

(56) References Cited

U.S. PATENT DOCUMENTS

2013/0252019 A1   9/2013   Sakaguchi et al.
2018/0324958 A1   11/2018  Bai et al.

FOREIGN PATENT DOCUMENTS

CN   105873352   8/2016
CN   105873371   8/2016
(Continued)

OTHER PUBLICATIONS

International Search Report English translation for International Application PCT/CN2019/078909 dated May 7, 2019.

*Primary Examiner* — Jeffrey D Washville
(74) *Attorney, Agent, or Firm* — Warner Norcross + Judd LLP (57) ABSTRACT

Disclosed is a method for manufacturing an LCP-based flexible copper-clad laminate, comprising: providing an LCP substrate and subjecting the LCP substrate to a Hall ion source pre-treatment; forming an ion-implanted layer in a certain depth range below the surface of the LCP substrate via ion implantation; performing plasma deposition to form a plasma deposition layer onto the ion-implanted layer; performing magnetron sputtering deposition to deposit copper ions onto the plasma deposition layer and form a magnetron sputtering deposition layer; and plating the magnetron sputtering deposition layer with a thickened copper layer to obtain the LCP-based flexible copper-clad laminate. Also disclosed is an LCP-based flexible copper-clad laminate, wherein a peeling strength between a copper foil and the LCP substrate of the LCP-based flexible copper-clad laminate is greater than or equal to 0.5 N/mm, a surface roughness between the two is smaller than or equal to 0.3 μm, a thickness tolerance of double-sided copper foil is not (Continued)

more than 4.3 μm, and a thickness tolerance of single-sided copper foil is not more than 3.4 μm.

22 Claims, 4 Drawing Sheets

(51) Int. Cl.
*C23C 14/20* (2006.01)
*C23C 14/35* (2006.01)
*C23C 14/48* (2006.01)
*C25D 3/38* (2006.01)

(52) U.S. Cl.
CPC ............ *C23C 14/205* (2013.01); *C23C 14/35* (2013.01); *C23C 14/48* (2013.01); *C25D 3/38* (2013.01)

(56) References Cited

FOREIGN PATENT DOCUMENTS

| | | | |
|---|---|---|---|
| CN | 105873381 | | 8/2016 |
| CN | 105899003 | | 8/2016 |
| CN | 106958009 | | 7/2017 |
| CN | 206388515 | | 8/2017 |
| CN | 107231747 | | 10/2017 |
| CN | 107620051 | | 1/2018 |
| CN | 107620051 A | * | 1/2018 |
| CN | 10841127 | | 8/2018 |
| JP | 2007-173818 | | 7/2007 |
| JP | 2014-22689 | | 11/2014 |
| JP | 2015-032605 | | 2/2015 |
| WO | 2012/093606 | | 7/2012 |

* cited by examiner

METHOD FOR MANUFACTURING LCP-BASED FLEXIBLE COPPER-CLAD PLATE, AND ARTICLE THEREOF

TECHNICAL FIELD

The present invention relates to a field of manufacturing a substrate for a circuit board, and particularly to a method for manufacturing a liquid crystal polymer (LCP) based flexible copper-clad laminate and an article thereof.

BACKGROUND

As an example of substrate, copper-clad laminate is widely utilized in industrial production of various products, e.g., circuit board (PCB). Depending on the substrates as used, the copper-clad laminate may generally be divided into a rigid copper-clad laminate (CCL) that is not prone to bend and a bendable flexible copper-clad laminate (FCCL).

With popularization of wearable and portable intelligent devices, such intelligent devices as smart phones, tablet computers, etc., have become indispensable necessities in human daily life. With rapid development of usage of mobile communication devices such as mobile phones that are short, light, thin, multifunctional, and are in pursuit of low losses and excellent electrical characteristics, there is an increasing demand for bendable flexible copper-clad laminates.

Currently, polyimide (PI) material is mostly used as an insulating substrate for producing a flexible copper-clad laminate. However, due to undue hydroscopicity, for example, of PI material, a reduced reliability of flexible printed circuit boards (FPCs) made therefrom is induced under conditions of high humidity, including such hazards as oxidation of copper foils and reduced peeling strength caused by evaporation of water vapor at high temperatures. Moreover, PI-based printed circuit boards are only applicable to producing high-frequency antennas with frequencies less than 6 GHz. With the development of high-frequency and high-speed mobile devices, the frequency in use is also increasing. For high-frequency antennas with frequencies greater than 6 GHz, the signal loss is rather large due to high dielectric constant (3.4) and high dielectric loss (0.02) of PI. Therefore, resin materials with low dielectric constant and low dielectric loss, such as the liquid crystal polymer (LCP) materials, have to be used.

LCP materials are thermoplastic resins with characteristics of a low hydroscopicity, a low thermal expansion coefficient, a low dielectric constant, and a high dimensional stability, etc., and can effectively remedy the defects of PI materials. Depending on their heat deflection temperatures (HDTs), LCP materials can be divided into three types, namely, a first type with an HDT greater than 270° C., mainly used in high temperature environments, a second type with an HDT between 240° C. and 270° C., and a third type with an HDT less than 240° C., which involves a slightly lower heating temperature and an excellent processing fluidity.

As to the LCP-based flexible copper-clad laminate, a traditional copper cladding method is mainly to control a temperature to be near the heat deflection temperature of the liquid crystal polymer, so that the liquid crystal polymer and the copper foil are directly pressed together, and are then cooled, solidified and bonded together to form an LCP-based flexible copper-clad laminate. Notably, during the pressing process, it is particularly crucial to control a pressing temperature and pressure, which determines the thickness uniformity and peeling strength magnitude of the flexible copper-clad laminate. If the temperature and pressure are non-uniform, the thickness and peeling strength of the copper-clad laminate will be rendered non-uniform, thereby affecting use of the flexible copper-clad laminate products. In addition, factors resulting in the non-uniform peeling strength also include surface roughness of the copper foil. When pressed together with the liquid crystal polymer, the surface roughness of the copper foil needs to be increased so as to achieve excellent bonding between them. However, high surface roughness of the copper foil will induce non-uniform peel surfaces, resulting in great fluctuations in peeling strength. Moreover, due to high roughness of the bonding surface between the copper foil and the liquid crystal polymer, the skin effect is prone to occur during high-frequency signal transmission, which also will affect the electrical properties of the liquid crystal polymer antenna. In addition, the liquid crystal polymer is a highly hydrophobic material; and even if its surface is subject to a traditional chemical or physical treatment, it would be still difficult to achieve an excellent bonding with metals, such as the copper foil.

Therefore, for high-frequency antennas, especially antennas with frequencies higher than 6 GHz, there is a need for an improved LCP-based flexible copper-clad laminate. The LCP-based flexible copper-clad laminate made therefrom is not only uniform in thickness and involves excellent bonding between the LCP substrate and the copper foil, but also can significantly reduce or even completely eliminate the skin effect prone to occur during high-frequency signal transmission.

SUMMARY OF THE INVENTION

In view of the above problems underlying the prior art, an object of the present invention is to provide a new method for manufacturing an LCP-based flexible copper-clad laminate, and to produce an LCP-based flexible copper-clad laminate with high bonding force and ultra-thin copper foil by the method. Such LCP-based flexible copper-clad laminate is mainly used for high-frequency antennas, especially for high-frequency antennas with frequencies higher than 6 GHz.

Specifically, the present invention provides a method for manufacturing an LCP-based flexible copper-clad laminate, comprising: providing an LCP substrate, and subjecting the LCP substrate to a Hall ion source pre-treatment to clean a surface of the LCP substrate; implanting first metal ions into the LCP substrate via ion implantation to form an ion-implanted layer in a certain depth range below the surface of the LCP substrate; performing plasma deposition on the LCP substrate subjected to ion implantation to deposit second metal ions onto the ion-implanted layer and form a plasma deposition layer; performing magnetron sputtering deposition to deposit copper ions onto the plasma deposition layer and form a magnetron sputtering deposition layer; and plating the magnetron sputtering deposition layer with a thickened copper layer to obtain the LCP-based flexible copper-clad laminate. Herein, a temperature of the LCP substrate is controlled to be always lower than 200° C. during the process of manufacturing the LCP-based flexible copper-clad laminate. In an embodiment, a peeling strength between a copper foil and the LCP substrate of the LCP-based flexible copper-clad laminate is greater than or equal to 0.5 N/mm, preferably greater than 0.9 N/mm. In an embodiment, a thickness tolerance of double-sided copper coil in the LCP-based flexible copper-clad laminate is not more than 4.3 μm, while a thickness tolerance of single-sided copper foil is not more than 3.4 μm.

According to the present invention, the Hall ion source pre-treatment comprises: increasing a temperature within a Hall source chamber to 40° C. to 120° C., by way of heating with a vacuum heating pipe. In an embodiment, while the temperature within the Hall source chamber is increased to 40° to 70° C., a treatment voltage is set to 1500V to 2000V, a treatment current is set to 1.5V to 2V, and a treatment time is set to 20 min to 30 min. In another embodiment, while the temperature within the Hall source chamber is increased to 70° C. to 100° C., the treatment voltage is set to 1000V to 1500V, the treatment current is set to 1 A to 1.5 A, and the treatment time is set to 10 min to 20 min. In a further embodiment, while the temperature within the Hall source chamber is increased to 100° C. to 120° C., the treatment voltage is set to 500V to 1000V, the treatment current is set to 0.04 A to 1 A, and the treatment time is set to 30 s to 10 min. Alternatively, the Hall ion source pre-treatment comprises: controlling a temperature of the LCP substrate at a range of 40° C. to 80° C., by controlling parameters of the Hall ion source. In an embodiment, a treatment voltage is set to 1500V to 2000V, a treatment current is set to 1.5 A to 2 A, and a treatment time is set to 30 s to 20 min; and the LCP substrate is controlled at a range of 40° C. to 80° C. In another embodiment, the treatment voltage is set to 1000V to 1500V, the treatment current is set to 1 A to 1.5 A, and the treatment time is set to 10 s to 20 min; and the LCP substrate is controlled at a range of 40° C. to 80° C. In yet another embodiment, the treatment voltage is set to 500V to 1000V, the treatment current is set to 0.04 A to 1 A, and the treatment time is set to 20 s to 30 min; and the LCP substrate is controlled at a range of 40° C. to 80° C.

According to an aspect of the present invention, a working gas of the Hall ion source includes argon, nitrogen, hydrogen, oxygen, carbon dioxide, and a mixed gas composed of a combination thereof. Preferably, a working gas of the Hall ion source includes oxygen, so as to remove residual impurities produced during the cleaning process via a chemical reaction with the oxygen on the surface of the LCP substrate.

According to another aspect of the present invention, during the ion implantation, an ion implantation voltage is set to 10 kV to 20 kV, an ion implantation current is set to 1 mA to 4 mA, and an implantation time is set to 40 s to 3 min. In an embodiment, the first metal ions are composed of one or more of copper, iron, chromium, nickel, molybdenum, manganese, titanium, and an alloy composed of a combination thereof. During the plasma deposition, the plasma deposition is configured to adopt a deposition current of 45 A to 70 A, a deposition energy of 10 eV to 30 eV, and a deposition time of 40 s to 3 min. In an embodiment, the second metal ions are composed of one or more of copper, iron, chromium, nickel, molybdenum, manganese, titanium, and an alloy composed of a combination thereof. During the magnetron sputtering deposition, a deposition current is set to 2 A to 10 A, a deposition voltage is set to 200V to 500V, and a deposition time is set to 40 s to 3 min. According to an embodiment, the method of the present invention further comprises: performing high temperature annealing treatment on the LCP-based flexible copper-clad laminate at a temperature of 200° C. to 300° C. for 30 s to 10 min, such that a bending resistance property of the LCP-based flexible copper-clad laminate shows at least more than 400 times of bending.

According to another aspect of the present invention, an LCP-based flexible copper-clad laminate is also provided, comprising: an LCP substrate; an ion-implanted layer implanted into the LCP substrate below a surface of the LCP substrate; a plasma deposition layer deposited onto the ion-implanted layer; a magnetron sputtering deposition layer deposited onto the plasma deposition layer; and a thickened copper layer plated onto the magnetron sputtering deposition layer. In an embodiment, a bonding surface between a copper foil and the LCP substrate of the LCP-based flexible copper-clad laminate according to the present invention has a surface roughness of ≤0.3 μm, and a peeling strength between the copper foil and the LCP substrate of the LCP-based flexible copper-clad laminate is greater than or equal to 0.5 N/mm. In another embodiment, a thickness tolerance of double-sided copper foil in the LCP-based flexible copper-clad laminate according to the present invention is not more than 4.3 μm, while a thickness tolerance of single-sided copper foil is not more than 3.4 μm.

Variations and improvements to those embodiments of the method described above fall within the scope and spirit of the present invention, and may be further described herein.

BRIEF DESCRIPTION OF DRAWINGS

The present invention will be described in detail below with reference to the drawings and in conjunction with examples, such that advantages and implementations of the present invention become more obvious. Herein, the contents shown in the drawings are used merely to explain the present invention, and do not limit the present invention in any sense. The drawings are only schematic and are not drawn strictly to scale. In the drawings.

DETAILED DESCRIPTION

Reference will be made in detail to the embodiments of the present invention, one or more examples of which are shown in the accompanying drawings. The respective examples are provided in a way of illustrating the present invention, rather than limiting the present invention. In fact, it will be apparent to those skilled in the art that various modifications and variations can be made to the invention without departing from the scope or spirit of the present invention. For example, features shown or described as a part of one embodiment may be used in conjunction with another embodiment to yield a still further embodiment. Therefore, the present invention is expected to include such modifications and variations falling within the scope of the appended claims and their equivalents.

Figure 1:
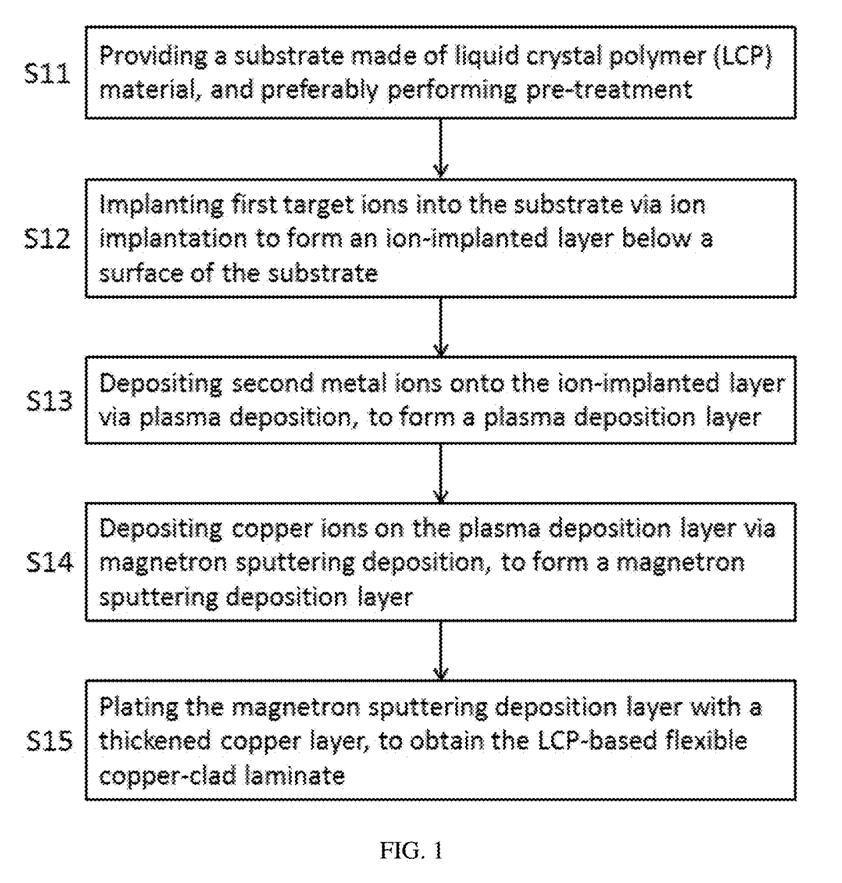
FIG. 1 is a flowchart of a method for manufacturing an LCP-based flexible copper-clad laminate according to an exemplary embodiment of the present invention.

FIG. 1 is a flowchart of a method for manufacturing an LCP-based flexible copper-clad laminate according to an exemplary embodiment of the present invention. First, at step S11, a substrate made of a liquid crystal polymer (LCP) material is provided. In an embodiment of the present invention, LCP insulating substrate is in the form of an organic polymer film. Preferably, pre-treatment on the LCP substrate is usually required in this step. A pre-treatment process may usually include a surface cleaning treatment. For example, a surface of the substrate may be wiped with alcohol-impregnated gauze so as to remove dirt adhered thereon, or the substrate may be placed in a cleaning solution and cleaned with ultrasonic waves, etc. However, it is difficult for such conventional cleaning methods to achieve optimal cleaning effects on copper-clad laminate substrates, especially on the LCP substrates. In the present invention, a Hall ion source cleaning process is adopted to perform pre-treatment on a LCP film, attaining a good surface optimization effect to facilitate subsequent deposition, electroplating and the like.

Generally, an ion source is a device that ionizes neutral atoms or molecules and draws ion beam current therefrom. Specifically, a Hall ion source uses emitted electrons to ionize gases filled into a vacuum chamber under the interaction of an electric field and a magnetic field in a vacuum environment, and emits ions under the action of the electric field and magnetic field. In general, the Hall ion source comprises a cathode, a housing, an anode, a gas pipe, and a magnetic field generator in sequence.

Figure 2:
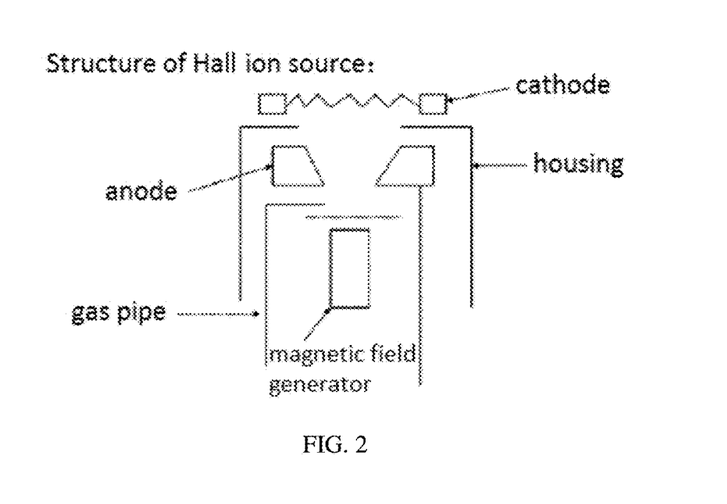
FIG. 2 is a schematic structural view of a Hall ion source according to an exemplary embodiment of the present invention.

As shown in FIG. 2, a Hall source chamber is defined within a housing by a magnetic field generator, an anode, and a cathode. A magnetic field generator (e.g., a magnet) generates a conical magnetic field within the Hall source chamber, and a neutralizing cathode (such as a cathode filament) is installed on its upper part. A working gas passes through a gas pipe and enters the Hall source chamber via a bottom of the anode, to participate in the discharging. In operation, the cathode filament is heated to generate hot electrons. When a positive potential is applied to the anode of the ion source, electrons move towards the anode under the electric field. Due to the magnetic field, the electrons travel in a spiral orbit around lines of magnetic force, and collide with atoms in the working gas and ionize them to produce ions. Afterwards, ions are accelerated to obtain corresponding energy under the action of Hall electric field, and together with a part of hot electrons emitted by the filament cathode, form a near plasma, which is emitted from the plasma source and interacts with the substrate to achieve the cleaning purpose.

Generally, a working gas of the ion source includes argon, nitrogen, hydrogen, oxygen, carbon dioxide, and a mixed gas composed of a combination thereof. Studies show that, when oxygen is used as the working gas under appropriate operating conditions, oxygen plasma may react with macromolecules to achieve a chemical cleaning effect to clean the macromolecules on a surface of the LCP film. Moreover, the oxygen plasma may also break carbon-oxygen double bonds in the LCP molecular structure to provide surface activity of the LCP film. To this end, in an embodiment of the present invention, a way of heating with a vacuum heating pipe is adopted prior to the Hall ion source treatment, to heat the Hall source chamber to a temperature of 40° C. to 120° C. Specifically, in an embodiment, while the temperature within the Hall source chamber reaches 40° C. to 70° C., a treatment voltage is set to 1500V to 2000V, a treatment current is set to 1.5V to 2V, and a treatment time is set to 20 min to 30 min. As a result, decontamination effect on the surface of LCP film is excellent. To achieve the same effective decontamination effect on the surface of LCP film, while the temperature within the Hall source chamber reaches 70° C. to 100° C., the treatment voltage is set to 1000V to 1500V, the treatment current is set to 1 A to 1.5 A, and the treatment time is set to 10 min to 20 min, in a preferred embodiment. In another preferred embodiment, while the temperature within the Hall source chamber reaches 100° C. to 120° C., the treatment voltage is set to 500V to 1000V, the treatment current is set to 0.04 A to 1 A, and the treatment time is set to 30 s to 10 min. Alternatively, different from using oxygen as the working gas, argon is used in an embodiment as the working gas for plasma cleaning. As an inert gas, though argon plasma may have higher energy to remove macromolecules on the surface of LCP film and can break carbon-oxygen double bonds in the LCP molecular structure, this is only a physical cleaning process, with impurities like carbon left to be adsorbed on the surface of LCP film, affecting peeling strength of the substrate. In view of the above, in a preferred embodiment, the present invention employs a mixed gas of oxygen and argon for the plasma cleaning. As such, argon may be used to increase energy, and the residual impurities produced during the cleaning process may be removed via a chemical reaction with oxygen.

Different from the aforementioned heating of the Hall source chamber to 40° C. to 120° C. prior to the Hall ion source treatment, in another preferred embodiment of the present invention, a temperature of the LCP substrate is directly controlled during the Hall ion source treatment. Studies show that, by controlling the temperature of the LCP substrate at a range of 40° C. to 80° C., it is possible to achieve the effects of excellent decontamination and enhanced activity of the LCP substrate. Specifically, in a preferred embodiment, a treatment voltage is set to 1500V to 2000V, a treatment current is set to 1.5 A to 2 A, and a treatment time is set to 30 s to 20 min, which can achieve the purpose of controlling the LCP substrate at a target temperature of 40° C. to 80° C. In order to control the LCP substrate at the target temperature, the treatment voltage is set to 1000V to 1500V, the treatment current is set to 1 A to 1.5 A, and the treatment time is set to 10 s to 20 min, in another preferred embodiment. In addition, the treatment voltage may also be set to 500 to 1000V, the treatment current be set to 0.04 A to 1 A, and the treatment time be set to 20 s to 30 min, so as to achieve the control of the LCP substrate at the target temperature of 40° C. to 80° C.

Studies show that, for the LCP-based flexible copper-clad laminate produced after the Hall ion source treatment according to the present invention, a peeling strength between a copper foil and the LCP substrate thereof is superior to the case of other pre-treatment methods, especially other Hall ion source treatments, and can be greater than or equal to 0.5 N/mm, preferably greater than 0.9 N/mm.

Subsequently, at step S12, first metal ions are implanted into the LCP substrate via ion implantation so as to form an ion-implanted layer in a certain depth range below a surface of the LCP substrate. Optionally, ion implantation can be performed below an upper surface, a lower surface, or both of the LCP substrate, to form the respective ion-implanted layers. In an embodiment, ion implantation can be performed by the following method. With conductive material selected as a target, a metal vapor vacuum arc ion source (MEVVA) is employed to ionize the target under the arc action in a vacuum environment to generate metal ions. Then, the ions are accelerated under a high-voltage electric field to possess extremely high energy (for example, 5 keV to 1000 keV, such as 10 keV, 50 keV, 100 keV, 200 keV, 500 keV, etc.). Next, high-energy metal ions directly impact the surface of the LCP insulating substrate at a very high speed, and are implanted to a certain depth range (for example, 1 nm to 100 nm, such as 5 nm, 10 nm, 20 nm, 50 nm, etc.) below the surface. A chemical bond or interstitial structure is created between the implanted metal ions and the material molecules of LCP substrate to make up a doped structure. An outer surface (or an upper surface) of the ion-implanted layer thus obtained is flush with an outer surface of an insulating surface layer of the LCP substrate, while an inner surface (or a lower surface) thereof goes deep into an interior of the insulating surface layer of the substrate. For example, the ion-implanted layer is located at a depth of 1 nm to 100 nm (for example, 5 nm to 50 nm) below the surface of the LCP substrate. At this time, an outer portion of the insulating surface layer of the substrate, due to formation of the ion-implanted layer, is formed as a part of a diffusion barrier layer.

During the ion implantation, ions of the target are forcibly implanted into an interior of the LCP substrate at a very high speed to form a doped structure with the LCP substrate, which is equivalent to the formation of a great number of foundation piles below the surface of the LCP substrate. Due to the foundation piles and the connection between the foundation piles and a subsequently formed conductor layer (a plasma deposition layer or a thickened conductor layer), a bonding force between the conductor layer and the LCP substrate of a finally obtained LCP substrate is rather high. Moreover, metal ions used for ion implantation are usually sized on the order of nanometers, and are distributed uniformly during the ion implantation, while incident angles relative to the surface of the LCP substrate are not much different. Therefore, the surface of the ion-implanted layer may be guaranteed with an excellent uniformity and compactness, and pinhole phenomenon is not prone to occur.

A variety of metals, alloys, conductive oxides, conductive carbides, conductive organic materials, and other conductive materials can be used as a target for the ion implantation, but are not limited thereto. Preferably, the ion implantation is performed by use of a metal or alloy with a strong bonding force to the substrate molecules, including copper, iron, chromium, nickel, molybdenum, manganese, titanium, and an alloy composed of a combination thereof. Moreover, the ion-implanted layer may include one or more layers.

Further, during the ion implantation, it is possible to adjust a depth of the ion-implanted layer into the interior of the insulating surface layer, that is, a depth of the inner surface of the ion-implanted layer below the surface of the substrate, by controlling various related parameters, e.g., implantation current, implantation voltage, implantation time and the like. In a preferred embodiment, the ion implantation voltage is 10 kV to 20 kV, the ion implantation current is 1 mA to 4 mA, and the implantation time is 40 s to 3 min.

Returning to FIG. 1, step S13 is performed after step S12. That is, plasma deposition is performed on the LCP substrate subjected to the ion implantation, so as to deposit second metal ions onto the ion-implanted layer and form a plasma deposition layer. Herein, the second metal and the first metal may be the same material or the different materials. Similar to the ion implantation process described above, the plasma deposition can also be performed with an ion implantation device, except that a lower extraction voltage is applied to make ions of the conductive material or the target have a much lower energy. That is to say, with conductive material as a target, the target is ionized under the arc action in a vacuum environment to generate ions, and then the ions are accelerated under a high-voltage electric field to possess a certain energy of for example 1 eV to 1000 eV. The accelerated metal ions fly to the surface of the LCP substrate and are deposited onto the ion-implanted layer previously formed below the surface of the substrate, forming a plasma deposition layer with a thickness of 1 nm to 10000 nm.

During the plasma deposition, conductive material that is the same as or different from that used during the ion implantation can be selected as a target. For example, various metals, alloys, conductive oxides, conductive carbides, conductive organics, and the like can be used, but are not limited thereto. Preferably, a metal or alloy that is well bonded to the ion-implanted layer is used for the plasma deposition. For example, copper, iron, chromium, nickel, molybdenum, manganese, titanium, and an alloy composed of a combination thereof can be used. Moreover, the plasma deposition layer may include one or more layers. Different from operating parameters in the ion implantation, the plasma deposition in a preferred embodiment of the present invention may adopt a deposition current of 45 A to 70 A, a deposition energy of 10 eV to 30 eV, and a deposition time of 40 s to 3 min.

During the plasma deposition, since the metal ions fly to the surface of LCP substrate at a relatively high speed and are deposited onto the ion-implanted layer previously formed below the surface, rendering a relatively great bonding force to the material of the ion-implanted layer, it is not easy for them to peel off from the surface of the LCP substrate. In addition, the metal ions used for the plasma deposition are usually sized on the order of nanometers, and are distributed uniformly during the plasma deposition, and incident angles relative to the surface of the LCP substrate are not much different. Hence, the surface of the resulting plasma deposition layer may be guaranteed with excellent uniformity and compactness, and pinhole phenomenon is not prone to occur.

Optionally, further included in an embodiment is the step S14 of performing magnetron sputtering deposition on the plasma deposition layer already obtained at step S13, so as to form a magnetron sputtering deposition layer. Different from plasma deposition, at step S14 according to an embodiment of the present invention, copper is used as the target. The deposition current is set to 2 A to 10 A, deposition voltage is set to 200V to 500V, and deposition time is set to 40 s to 3 min, to perform the magnetron sputtering deposition.

Finally, step S15 is further included in an embodiment, wherein the plasma deposition layer or the magnetron sputtering deposition layer is plated with a thickened copper layer so as to improve conductivity. Preferably, an electroplating method is used to form the thickened copper layer. Compared with the electroless plating, vacuum evaporation plating, sputtering and the like, the electroplating method is fast, low in cost, and is applicable to a wide range of electroplatable materials, such as Cu, Ni, Sn, Ag and alloys thereof. In an embodiment of the present invention, the LCP substrate is thickened by means of electroplating to 2 µm to 36 µm, so as to form the LCP-based flexible copper-clad laminate.

Figure 8:
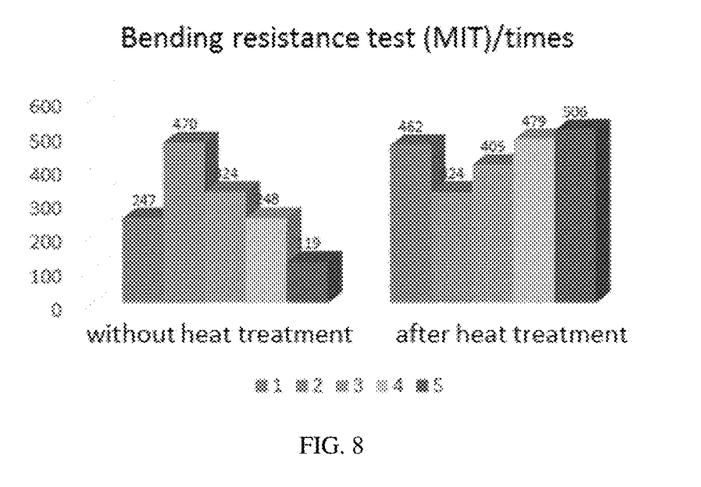
FIG. 8 shows a comparison diagram of the bending resistance properties between the LCP-based flexible copper-clad laminates prepared according to the present invention after heat treatment and without heat treatment.

In addition, the LCP-based flexible copper-clad laminate is preferably subject to a high-temperature annealing treatment at a temperature of 200° C. to 300° C. for 30 s to 10 min, so as to eliminate stress in the copper foil and to improve flexibility of the copper foil, improving bending resistance properties of the LCP-based flexible copper-clad laminate. FIG. 8 illustrates a comparison diagram of bending resistance properties between LCP-based flexible copper-clad laminates prepared according to the present invention after heat treatment and without heat treatment. As shown, the bending resistance property of the LCP-based flexible copper-clad laminate after heat treatment shows at least more than 400 times of bending, obviously better than the LCP-based flexible copper-clad laminate without heat treatment.

Figure 3:
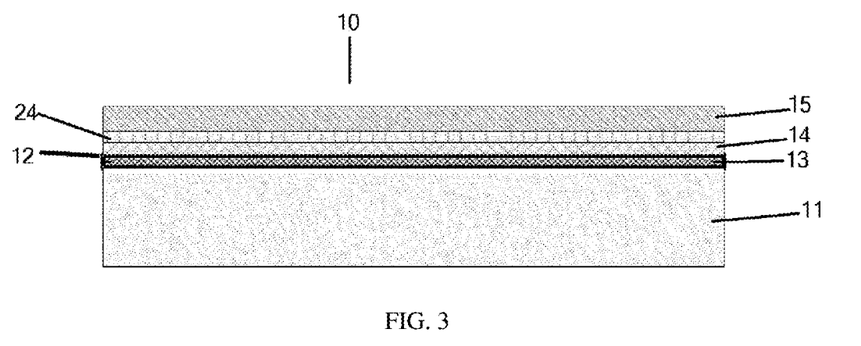
FIG. 3 is a schematic cross-sectional view of a single-sided LCP-based flexible copper-clad laminate prepared according to the method of FIG. 1.

FIG. 3 illustrates a schematic cross-sectional view of a single-sided LCP based flexible copper-clad laminate prepared by the method of the present invention, according to an embodiment. As shown, the LCP-based flexible copper-clad laminate 10 includes an LCP substrate 11 such as an LCP film, an ion-implanted layer 13 implanted into the LCP substrate 11 below a surface 12 of the LCP substrate, a plasma deposition layer 14 deposited onto the ion-implanted layer 13, a magnetron sputtering deposition layer 24 deposited onto the plasma deposition layer 14, and a thickened copper layer 15 plated onto the magnetron sputtering deposition layer 24. Similar to the method for manufacturing a single-sided LCP-based flexible copper-clad laminate, it is possible to form a double-sided LCP-based flexible copper-clad laminate by simultaneously or successively performing the above-mentioned processes on both sides of the copper-clad laminate.

Figure 4:
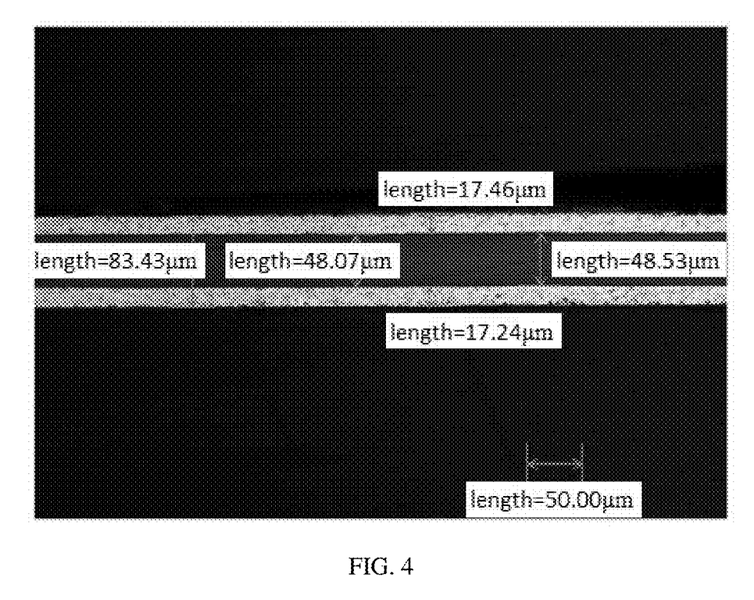
FIG. 4 shows a cross-sectional view of a double-sided LCP-based flexible copper-clad laminate according to an embodiment of the present invention.

FIG. 4 illustrates an enlarged cross-sectional view of a double-sided LCP-based flexible copper-clad laminate according to an embodiment of the present invention. As shown, in the LCP-based flexible copper-clad laminate, a thickness of the LCP substrate is maintained at a range of 17.24 µm to 17.46 µm. Tests show that, in the LCP-based flexible copper-clad laminate prepared according to the invention, a bonding surface between the copper foil and the LCP substrate may have a surface roughness of ≤0.3 µm and a peeling strength of ≥0.5 N/mm. Meanwhile, the LCP substrate with little deformation and a substantially stable thickness can achieve great thickness uniformity (for example, thickness tolerance of FCCL with a double-sided copper foil is not more than 4.3 µm, and thickness tolerance of FCCL with a single-sided copper foil is not more than 3.4 µm). This is because, during the entire process of manufacturing a LCP-based flexible copper-clad laminate, the temperature can always be lower than 200° C. and there is no pressing action. In the absence of copper foil pressing, roughness of a bonding surface between the copper foil and the LCP film is equivalent to the surface roughness of the LCP film. Therefore, for the LCP-based flexible copper-clad laminate according to the present invention, it is not necessary to increase the roughness to improve the peeling strength, and so it involves lower roughness while satisfying a great peeling strength. Preferably, according to the present invention, the bonding surface between the copper foil and the LCP substrate of the LCP-based flexible copper-clad laminate can achieve a surface roughness of ≤0.3 µm, and a peeling strength of ≥0.5 N/mm, or even 0.9 N/mm, by controlling process parameters in the manufacturing process.

Figure 5:
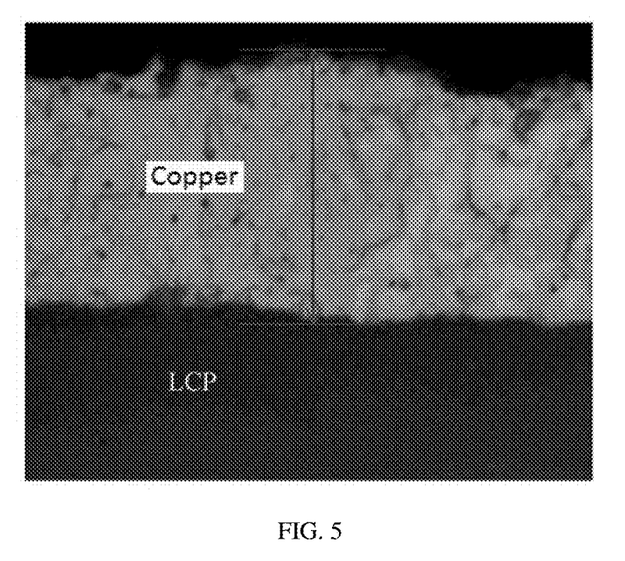
FIG. 5 shows an enlarged cross-sectional view of a bonding surface of an LCP-based flexible copper-clad laminate prepared by a conventional pressing method.
Figure 6:
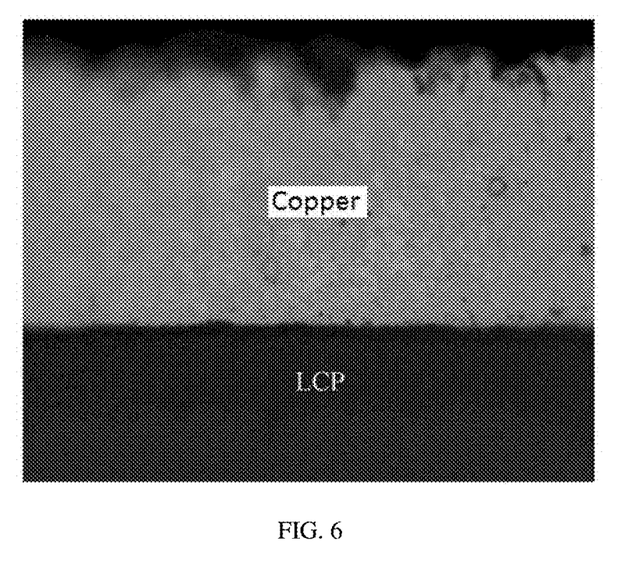
FIG. 6 shows an enlarged cross-sectional view of a bonding surface of an LCP-based flexible copper-clad laminate prepared according to the method of the present invention.
Figure 7:
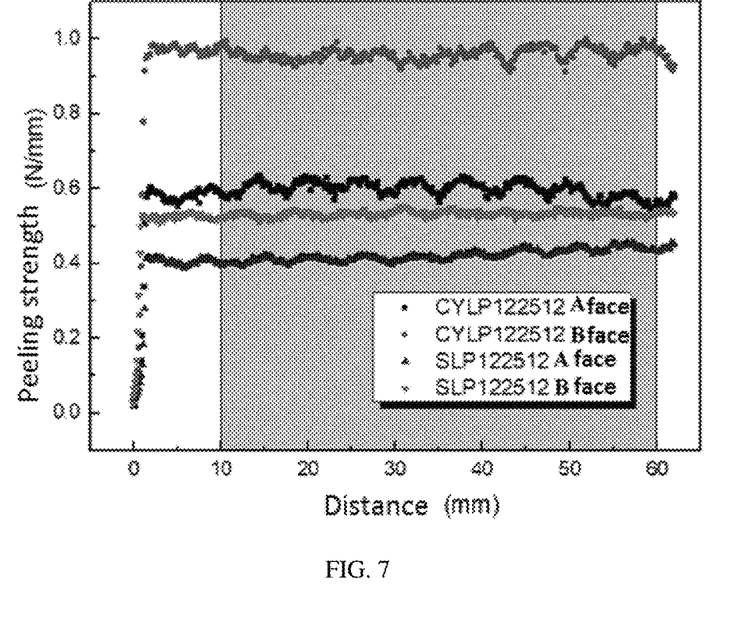
FIG. 7 shows a comparison diagram of the peeling strength between the LCP-based flexible copper-clad laminates made by a pressing method and by the method of the present invention.

For ease of reference, FIG. 5 shows an enlarged cross-sectional view of a bonding surface of an LCP-based flexible copper-clad laminate prepared by a conventional pressing method, and FIG. 6 illustrates an enlarged cross-sectional view of a bonding surface of an LCP-based flexible copper-clad laminate prepared according to the method of the present invention. Compared with the conventional pressing method, the bonding surface between the LCP substrate and the copper foil of the LCP-based flexible copper-clad laminate prepared according to the present invention has an obviously lower roughness. In addition, FIG. 7 also shows a comparison diagram of peeling strength between the LCP-based flexible copper-clad laminates made by the pressing method and by the method of the present invention. The abscissa in the figure represents the distance of the LCP-based flexible copper-clad laminate during peeling of the copper foil and the LCP substrate, and the ordinate represents the peeling strength. As shown, a total of 4 peeling curves are shown, the upper two of which show peeling strength at two different surfaces of the LCP-based flexible copper-clad laminates prepared under different manufacturing conditions according to the present invention, both being greater than 0.5 N/mm. The two lower peeling curves in FIG. 7 represent peeling strength of two different surfaces of the LCP-based flexible copper-clad laminates prepared according to the traditional pressing method. By comparison, peeling strength of the LCP-based flexible copper-clad laminate prepared by the traditional pressing method is significantly lower than peeling strength of the LCP-based flexible copper-clad laminate prepared according to the present invention.

Further, as described above, FIG. 8 shows a comparison diagram of bending resistance properties between the LCP-based flexible copper-clad laminates prepared according to the present invention after heat treatment and without heat treatment. Herein, bending resistance property of the LCP-based flexible copper-clad laminate after heat treatment shows at least more than 400 times of bending, significantly better than that of the LCP-based flexible copper-clad laminate without the heat treatment.

The LCP-based flexible copper-clad laminate according to the present invention, due to its great peeling strength (≥0.5 N/mm) and excellent bending resistance property, is guaranteed with reliability of antenna circuit and great thickness uniformity (a thickness tolerance of FCCL with double-sided copper foil is not more than 4.3 µm, and the thickness tolerance of FCCL with single-sided copper foil is not more than 3.4 µm), to ensure consistency of antenna performance. Moreover, a bonding surface between the LCP substrate and the metal layer has relatively low surface roughness, so the signal loss is small during high-frequency transmission. Given that the reliability of antenna circuit, the consistency of antenna performance, and the surface roughness of antenna's conductor layer all are crucial for the high-frequency transmission, they become key indicators for evaluating the performance of high-frequency antenna. The LCP-based flexible copper-clad laminate of the present invention is obviously superior to the existing LCP-based flexible copper-clad laminate in terms of the abovementioned aspects. Thus, the present invention provides a very advantageous solution for the high-frequency antenna transmission.

This written description uses examples including the best mode(s) to disclose the present invention, and also enables those skilled in the art to implement the present invention, involving making and using any device or system, and performing any combined method. The patentable scope of the present invention is defined by claims, and may include other examples envisaged by those skilled in the art. If these other examples have structural elements not different from the written language of the claims, or if they include equivalent structural elements not substantially different from the written language of the claims, such examples shall be deemed to fall within the scope of the claims.

What is claimed is:

1. A method for manufacturing an LCP-based flexible copper-clad laminate, comprising:
    providing an LCP substrate, and subjecting the LCP substrate to a Hall ion source pre-treatment, to clean a surface of the LCP substrate;
    implanting first metal ions into the LCP substrate via ion implantation, to form an ion-implanted layer in a certain depth range below the surface of the LCP substrate;
    performing plasma deposition on the LCP substrate subjected to the ion implantation, to deposit second metal ions onto the ion-implanted layer and form a plasma deposition layer;
    performing magnetron sputtering deposition to deposit copper ions onto the plasma deposition layer and form a magnetron sputtering deposition layer; and
    plating the magnetron sputtering deposition layer with a thickened copper layer to obtain the LCP-based flexible copper-clad laminate,
    wherein a temperature of the LCP substrate is controlled to be always lower than 200° C. during the process of manufacturing the LCP-based flexible copper-clad laminate; and
    wherein during the ion implantation, an ion implantation voltage is set to 10 kV to 20 kV, an ion implantation current is set to 1 mA to 4 mA, and an implantation time is set to 40 s to 3 min.

2. The method according to claim 1, wherein a peeling strength between a copper foil and the LCP substrate of the LCP-based flexible copper-clad laminate is greater than or equal to 0.5 N/mm.

3. The method according to claim 1, wherein a thickness tolerance of double-sided copper coil in the LCP-based flexible copper-clad laminate is not more than 4.3 μm, while a thickness tolerance of single-sided copper foil is not more than 3.4 μm.

4. The method according to claim 1, wherein the Hall ion source pre-treatment comprises: increasing a temperature within a Hall source chamber to 40° C. to 120° C., by way of heating with a vacuum heating pipe.

5. The method according to claim 4, wherein while the temperature within the Hall source chamber is increased to 40° to 70° C., a treatment voltage is set to 1500V to 2000V, a treatment current is set to 1.5 A to 2 A, and a treatment time is set to 20 min to 30 min.

6. The method according to claim 4, wherein while the temperature within the Hall source chamber is increased to 70° C. to 100° C., a treatment voltage is set to 1000V to 1500V, a treatment current is set to 1 A to 1.5 A, and a treatment time is set to 10 min to 20 min.

7. The method according to claim 4, wherein while the temperature within the Hall source chamber is increased to 100° C. to 120° C., a treatment voltage is set to 500V to 1000V, a treatment current is set to 0.04 A to 1 A, and a treatment time is set to 30 s to 10 min.

8. The method according to claim 1, wherein the Hall ion source pre-treatment comprises: controlling a temperature of the LCP substrate at a range of 40° C. to 80° C., by controlling parameters of the Hall ion source.

9. The method according to claim 8, wherein a treatment voltage is set to 1500V to 2000V, a treatment current is set to 1.5 A to 2 A, and a treatment time is set to 30 s to 20 min, and wherein the LCP substrate is controlled at a range of 40° C. to 80° C.

10. The method according to claim 8, wherein a treatment voltage is set to 1000V to 1500V, a treatment current is set to 1 A to 1.5 A, and a treatment time is set to 10 s to 20 min, and wherein the LCP substrate is controlled at a range of 40° C. to 80° C.

11. The method according to claim 8, wherein a treatment voltage is set to 500V to 1000V, a treatment current is set to 0.04 A to 1 A, and a treatment time is set to 20 s to 30 min, and wherein the LCP substrate is controlled at a range of 40° C. to 80° C.

12. The method according to claim 1, wherein a working gas of the Hall ion source includes argon, nitrogen, hydrogen, oxygen, carbon dioxide, and a mixed gas composed of a combination thereof.

13. The method according to claim 1, wherein during the plasma deposition, the plasma deposition is configured to adopt a deposition current of 45 A to 70 A, a deposition energy of 10 eV to 30 eV, and a deposition time of 40 s to 3 min.

14. The method according to claim 1, wherein during the magnetron sputtering deposition, a deposition current is set to 2 A to 10 A, a deposition voltage is set to 200V to 500V, and a deposition time is set to 40 s to 3 min.

15. The method according to claim 1, further comprising: performing high temperature annealing treatment on the LCP-based flexible copper-clad laminate at a temperature of 200° C. to 300° C. for 30 s to 10 minutes, such that a bending resistance property of the LCP-based flexible copper-clad laminate shows at least more than 400 times of bending.

16. The method according to claim 1, wherein a bonding surface between a copper foil and the LCP substrate of the LCP-based flexible copper-clad laminate has a surface roughness of ≤0.3 μm.

17. An LCP-based flexible copper-clad laminate manufactured according to the method of claim 1, the LCP-based flexible copper-clad laminate comprising:
    an LCP substrate;
        an ion-implanted layer implanted into the LCP substrate below a surface of the LCP substrate;
        a plasma deposition layer deposited onto the ion-implanted layer;
        a magnetron sputtering deposition layer deposited onto the plasma deposition layer; and
        a thickened copper layer plated onto the magnetron sputtering deposition layer,
        wherein a bonding surface between a copper foil and the LCP substrate of the LCP-based flexible copper-clad laminate can reach a surface roughness of ≤0.3 μm.

18. The LCP-based flexible copper-clad laminate according to claim 17, wherein a peeling strength between the copper foil and the LCP substrate of the LCP-based flexible copper-clad laminate is greater than or equal to 0.5 N/mm.

19. The LCP-based flexible copper-clad laminate according to claim 17, wherein a thickness tolerance of double-sided copper foil in the LCP-based flexible copper-clad laminate is not more than 4.3 μm, while a thickness tolerance of single-sided copper foil is not more than 3.4 μm.

20. The method according to claim 1, wherein a working gas of the Hall ion source includes oxygen.

21. The method according to claim 1, wherein the first metal ions are copper ions.

22. The method according to claim 1, wherein the second metal ions are copper ions.

\* \* \* \* \*